United States Patent [19]

Jenkins

[11] Patent Number: 4,701,700
[45] Date of Patent: Oct. 20, 1987

[54] CAPTIVATED, PRE-LOADED SPRING MEANS FOR VACUUM DISPLACED CIRCUIT BOARD TESTING

[76] Inventor: Jack E. Jenkins, 6322 Temple City Blvd., Temple City, Calif. 91780

[21] Appl. No.: 803,161

[22] Filed: Dec. 2, 1985

[51] Int. Cl.$^4$ ............................................. G01R 31/02
[52] U.S. Cl. ............................. 324/158 F; 324/73 PC
[58] Field of Search ............ 324/158 F, 158 P, 73 PC

[56] References Cited

U.S. PATENT DOCUMENTS

| | | | |
|---|---|---|---|
| 4,230,985 | 10/1980 | Matrone et al. | 324/158 F |
| 4,321,533 | 3/1982 | Matrone | 324/73 PC |
| 4,536,051 | 8/1985 | Smith et al. | 324/158 F |

Primary Examiner—Ernest F. Karlsen
Attorney, Agent, or Firm—William W. Haefliger

[57] ABSTRACT

Circuit board testing apparatus includes combination comprising structure including two generally parallel plates defining a space therebetween to which vacuum is applicable, there being circuit test probes projecting toward said space, and associated with one or the other of the plates, the remaining plate adapted to receive a circuit board for circuit testing; pre-loaded, resiliently deflectible devices including captivated springs carried by one or the other of the plates, so that such devices project into said space; and seal means on the remaining plate to be engaged by the circuit board for positive pressure sealing in response to vacuum application to said spaced. As a result, the vacuum in said space effects such sealing as one of the other of the plates is relatively movable forwardly toward the other in response to such vacuum application, thereby to further resiliently load the preloaded devices and to cause the probes to engage circuit board circuitry only after such sealing has been effected.

11 Claims, 4 Drawing Figures

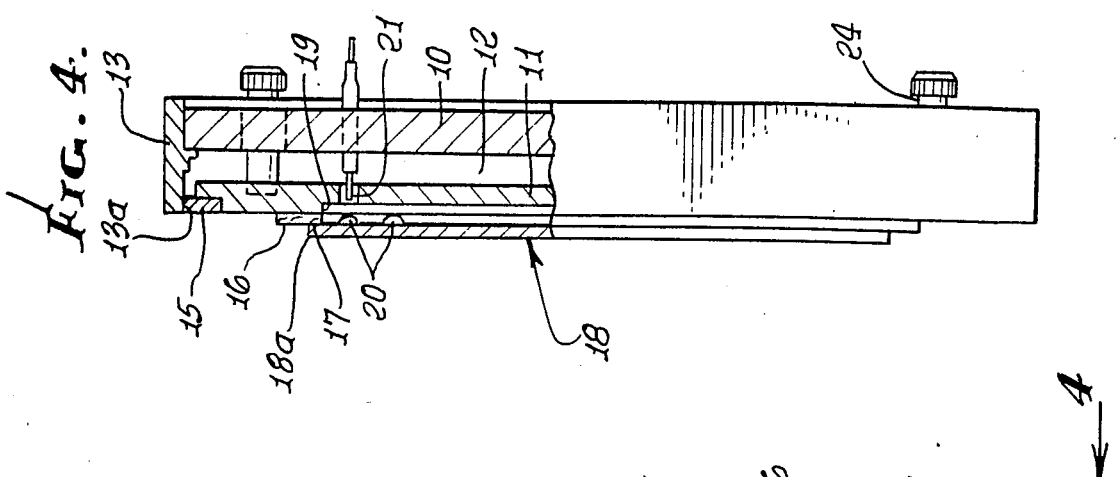
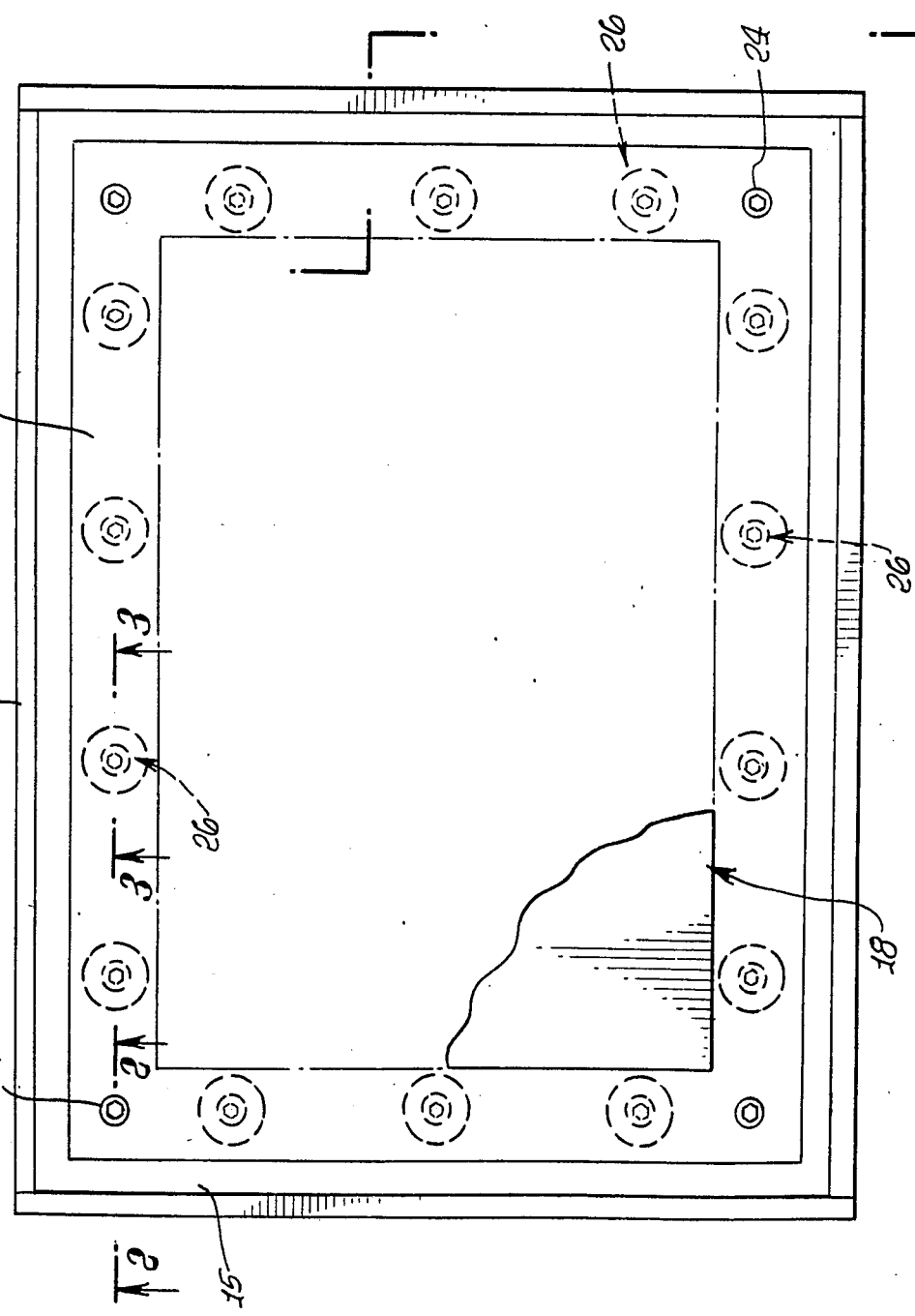

4,701,700

CAPTIVATED, PRE-LOADED SPRING MEANS FOR VACUUM DISPLACED CIRCUIT BOARD TESTING

BACKGROUND OF THE INVENTION

This invention relates generally to testing of circuit boards, and more particularly to improvements in test fixtures used for such purposes.

Such fixtures presently include upper and lower insulative plates, the circuit board removably supported on the upper plate to present its solder connections for engagement with test probes associated with the lower plate. Vacuum applied to the space between the plates effects relative movement of the upper plate and circuit board toward the lower plate, to engage the test probes with the solder or printed connections, leads, etc. at the underside of the circuit board.

One problem that exists is the tendency for the test probes to exert sufficient force on the circuit board as to break the seal between that board and the upper plate, whereby the vacuum urging the top plate toward the lower plate is destroyed, and testing is interrupted. The problem increases as the number of test probes needed to test the circuitry on the board increases, and since the total force tending to lift the circuit board and break the vacuum increases as a function of the number of spring urged test probes utilized.

Another problem that arises is the difficulty of removing the upper plate off the test fixture for maintenance purposes—i.e. to allow clean-out of solder particles from the space between the boards, such particles otherwise increasing the risk of electrical shorts, as by engagement with test probes. Presently, the structures used to limit upper plate downward displacement toward the lower plate during testing, project through the upper plate, and it requires release of all such multiple structures before the upper plate can be lifted away, to expose the space between the plates.

SUMMARY OF THE INVENTION

It is a major object of the invention to provide solutions to the above problems, as well as to provide unusually effective structural improvements in test fixtures of the type referred to. Basically, the invention is embodied in circuit board testing apparatus that includes:

(a) structure including two generally parallel plates defining a space therebetween to which vacuum is applicable, there being circuit test probes projecting toward said space, and associated with one or the other of the plates, the remaining plate adapted to receive a circuit board for circuit testing, (b) pre-loaded, resiliently deflectible means including captivated springs carried by one or the other of the plates, so that said means projects into said space, (c) there being seal means on said remaining plate to be engaged by the circuit board for positive pressure sealing in response to vacuum application to said space, (d) whereby vacuum in said space effects said sealing as one of the other of the plates is relatively movable forwardly toward the other in response to said vacuum application, thereby to further resiliently load said pre-loaded means and to cause said probes to engage circuit board circuitry only after said sealing has been effected.

As will appear, the resiliently deflectable means is carried by one plate, as for example the lower plate, and projects into the space between the plates, but is generally confined below the upper plate so as to enable free and quick removal of the latter away from the fixture, as during maintenance. To this end, the resiliently deflectible means includes spring captivating stops in said space, the springs confined between said stops and said one plate and being pre-compressed coil springs. Also provided are guide shafts attached to said stops, the said one plate defining guide bores within which said shafts are guided during further compression of said springs in response to displacement of said stops toward said one plate by said other plate. Shoulders on the shafts are engagable with shoulders carried on said one plate to limit displacement of said shafts and expansion of said springs toward said other plate in response to relative rearward movement of said other plate away from said one plate and disengagement with said stops.

As a result, the circuit board periphery, which may be irregular due to terminals or other circuitry at the periphery, is enabled to positively and sealingly engage a seal layer (as for example elastomer foam) on the upper plate during a dwell time period corresponding to vacuum build-up to a level sufficient to allow the upper plate to further compress the captivated, pre-loaded springs as described, and move downwardly to effect test probe engagement with the board circuitry.

These and other objects and advantages of the invention, as well as the details of an illustrative embodiment, will be more fully understood from the following specification and drawings, in which:

DRAWING DESCRIPTION

FIG. 1 is a plan view of a test fixture;

FIG. 4 is a view taken on lines 4—4 of FIG. 1.

DETAILED DESCRIPTION

Figure 2:
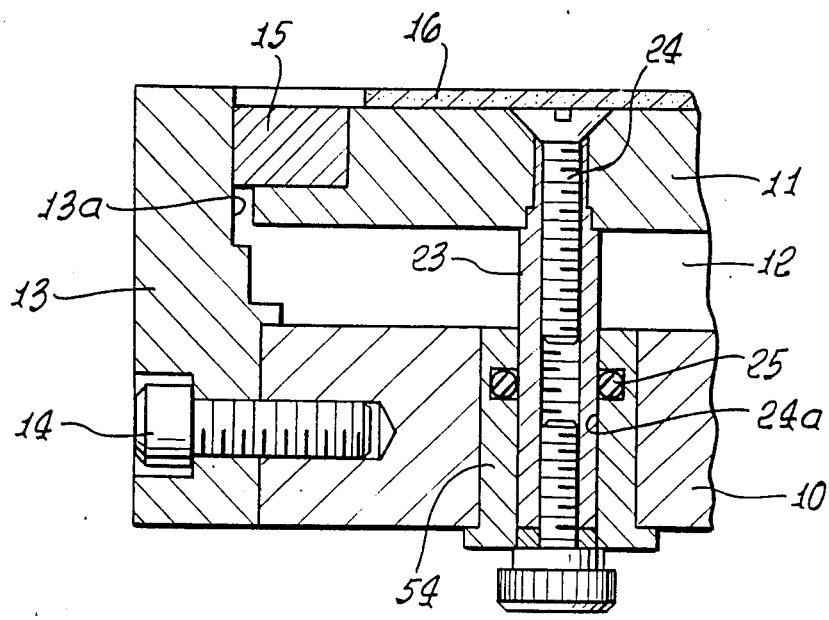
FIG. 2 is an enlarged fragmentary view taken in section at 2—2 of FIG. 1.

The illustrated circuit board testing apparatus includes two generally parallel plates, as at 10 and 11, defining a space 12 between them to which vacuum is applicable. A rectangular frame 13 bounds both plates, and may be attached to plate 10, as by fasteners 14. One or the other of the plates is relatively movable toward the other in response to such vacuum application, and in the example top plate 11 is so movable toward plate 10. A seal 15 carried by plate 11 seals off against the inner surface 13a of the frame, during such movement.

Seal means, such as resilient elastomer layer 16 is carried by plate 11 to be engaged by a circuit board, as for example a printed circuit board 18 for positive pressure sealing, as at interface 17, in response to vacuum application to space 12. For example, the board rectangular edge 18a may overlap the sealing layer, there being a rectangular opening 19 formed in plate 11, and layer 16, the circuit board extending over the opening so as to downwardly expose soldered cirucit pathways and connections 20 to contact with resilient, i.e. spring urged test probes 21. The latter project toward space 12 and are associated with board 10. See FIG. 4. When board 11 is sufficiently vacuum deflected toward board 10, the selected test probes are forcibly engaged by the soldered circuitry on the board, making test electrical connections, for circuit continuity, etc., as is known.

Board 10 movement toward board 11 is guided, as for example by structure as shown in FIG. 2, or other guide structure. In FIG. 2, a guide shaft 23 (attached to plate 11 as by screw 24) is slidably guided in the bore 24a of guide bushing 54 suitably attached to plate 10. O-ring 25 seals off between shaft 23 and bore 24a.

Figure 3:
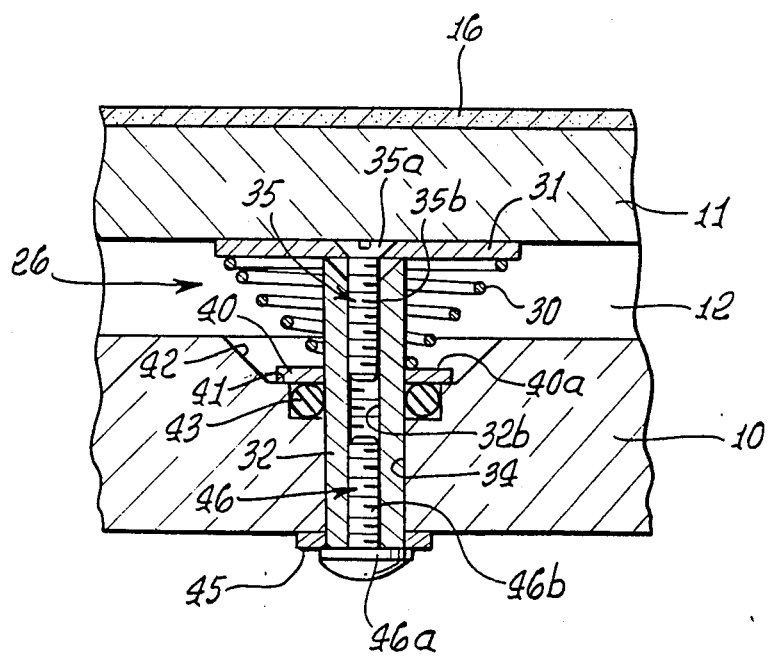
FIG. 3 is an enlarged fragmentary view taken in section at 3—3 of FIG. 1.

In accordance with an important aspect of the invention, pre-loaded, resiliently deflectible means is provided to project into space 12, to limit displacement of plate 11 toward plate 10. Such means typically includes multiple assemblies 26 one of which is shown in FIG. 3, the assemblies being spaced about the area of the board 10, and at different locations about the opening 19 as shown in FIG. 1. One purpose of such assemblies is to resiliently resist, and ultimately interrupt downward movement of plate 11 toward plate 10 at such time as the probes 21 have been deflected to predetermined extent by the board circuitry, making said electrical contact therewith.

As shown in FIG. 3, each assembly includes a captured, i.e. "captivated" spring 30, in the form of a tapered coil spring. The large end of the spring forcibly engages a stop in the form of a washer 31, the spring initially being partially compressed, or pre-loaded, as determined by the position of the washer. A tubular guide shaft 32 may be attached to the washer and extends downwardly and slidably through a guide bore 34 in plate 10, as shown. The upper end of the shaft extends proximate the head 35a of a fastener 35, whose shank 35b is thread connected to bore 32b of the tubular guide shaft or sleeve 32. A stop washer 45 is carried at the lower end of sleeve 32, and engages the underside of the plate 10, prior to downward displacement of the plate 11 to engage washer 31, whereby the springs of all the like assemblies are initially pre-loaded. Washer 45 is retained by head 46a of a fastener 46 whose shank 46b is also thread connected to bore 32b.

Accordingly, when vacuum is applied to space 12, and plate 11 engages washers 31, the plate 11 cannot move downwardly further, i.e. toward plate 10, until the vacuum has increased sufficiently to reach the level of the upward force exerted by all of the springs 30 on the washers 31 (plate 10 engaging all such washers prior to their downward displacement). This assures or provides a "dwell" time corresponding to vacuum build-up, allowing the vacuum to urge the circuit board 18 downwardly to compress the seal layer 16, providing or establishing a good seal at interface 17, prior to the engagement of the probes 21 with the underside of the circuit board, and exerting upward force thereon ending to prevent establishment of the seal. Therefore, the cirucit board maintains its seal to layer 16, and the vacuum is not broken, during probe engagement with the circuit connectors 20, for testing purposes. In this regard, spring urged probe upward force on the circuit board can be high when the number of probes being used for testing purposes is high.

It will be further noted that the assemblies 26 are confined below the board 11, i.e. do not project upwardly through that board, whereby board 11 can easily be removed upwardly from the frame, i.e. away from the assemblies, for maintenance purposes. Such maintenance for example includes removal of solder particles that may fall into space 12 from circuit boards being tested, such particles increasing the risk of electrical shorts if they are left in space 12.

Note that the small end of spring 30 is supported on a shoulder 40a at the upper side of a plate 40 seated on a shoulder 41 in recess 42 in plate 10. An O-ring 43 below plate 40 seals off between the shaft 32 and the recess bore 44, to maintain the vacuum in space 12.

I claim:

1. In a circuit board testing apparatus, the combination comprising (a) structure including two generally parallel plates defining a space therebetween to which vacuum is applicable, there being circuit test probes projecting toward said space, and associated with one or the other of the plates, the remaining plate adapted to receive a circuit board for circuit testing, (b) pre-loaded, resiliently deflectible means including captivated pre-compressed springs carried by one or the other of the plates, so that said means projects into said space, (c) there being seal means on said remaining plate to be engaged by the circuit board for positive pressure sealing in response to vacuum application to said space, (d) whereby vacuum in said space effects said sealing as one of the other of the plates is relatively movable forwardly toward the other in response to said vacuum application, thereby to further resiliently load said preloaded means and to cause said probes to engage circuit board circuitry only after said sealing has been effected, (e) said resiliently deflectible means being carried by said one plate and projecting into said space toward the other and remaining plate, to be engaged by said other plate in response to said plate relative movement, (f) said resiliently deflectible means including spring captivating stops in said space, the springs confined between said stops and said one plate and being precompressed coil springs, the stops retained to said one plate independently of the other plate.

2. The combination of claim 1 wherein said one plate defines recesses opening toward said space, and there being spring seating shoulders in said recesses.

3. The combination of claim 1 wherein there are guide shafts attached to said stops, the said one plate defining guide bores within which said shafts are guided during further compression of said springs in response to displacement of said stops toward said one plate by said other plate, the shafts retained to said one plate.

4. The combination of claim 3 including shoulders on said shafts engagable with shoulders carried on said one plate to limit displacement of said shafts and expansion of said springs toward said other plate in response to relative rearward movement of said other plate away from said one plate and disengagement with said stops.

5. The combination of claim 1 including said circuit board peripherally engaging said seal.

6. The combination of claim 1 including a frame carrying both said plates.

7. The combination of claim 1 including guide means spaced from said pre-loaded means to guide relative movement of the plates toward and away from one another.

8. The combination of claim 1 wherein said preloaded, resiliently deflectible means are entirely free of attachment to said remaining plate.

9. The combination of claim 1 including a frame bounding said plates and to which said one plate is attached, so that said remaining plate is movable toward and away from said one plate and toward and away said resiliently deflectible means which is everywhere located closer to said one plate than to said remaining plate.

10. The combination of claim 3 including vacuum sealing O-rings about said shafts and engaging said bores.

11. The combination of claim 3 including other stop shoulders on the guide shafts to engage said one plate and limit guide shaft displacement toward said other plate.

* * * * *